(12) United States Patent
Kim

(10) Patent No.: US 7,764,545 B2
(45) Date of Patent: Jul. 27, 2010

(54) ADDRESS REPLACING CIRCUIT AND SEMICONDUCTOR MEMORY APPARATUS HAVING THE SAME

(75) Inventor: Keun-Kook Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 344 days.

(21) Appl. No.: 12/026,470

(22) Filed: Feb. 5, 2008

(65) Prior Publication Data

US 2009/0059709 A1 Mar. 5, 2009

(30) Foreign Application Priority Data

Sep. 5, 2007 (KR) .................. 10-2007-0089887

(51) Int. Cl.
*G11C 16/04* (2006.01)

(52) U.S. Cl. .................. 365/185.11; 365/230.03; 365/230.01; 365/185.23; 365/230.04; 365/230.06; 365/233.19; 365/238.5

(58) Field of Classification Search ............ 365/185.11, 365/230.03, 230.01
See application file for complete search history.

(56) References Cited

U.S. PATENT DOCUMENTS 6,167,498 A 12/2000 Larson et al.
6,944,078 B2 9/2005 Jeong et al.
7,151,709 B2 12/2006 Pawlowski
7,489,534 B2 * 2/2009 Ko .............................. 365/52
7,539,073 B2 * 5/2009 Kim et al. ................... 365/203
7,630,271 B2 * 12/2009 Kim et al. .............. 365/230.03
2006/0250870 A1 11/2006 Cho

FOREIGN PATENT DOCUMENTS

JP 2001014890 1/2001
JP 2003-187589 7/2003

* cited by examiner

*Primary Examiner*—Hoai V Ho
*Assistant Examiner*—Fernando N Hidalgo
(74) *Attorney, Agent, or Firm*—Baker & McKenzie LLP

(57) ABSTRACT

An address replacing circuit includes a sub-bank region selecting unit that allows a first sub-bank region or a second sub-bank region to be selectively activated, in response to a row address and first and second bits of a column address in accordance with operation modes a first column region activating unit that generates a first column region activating address and a second column region activating address from the first bit of the column address, a second column region activating unit that generates a third column region activating address and a fourth column region activating address from the second bit of the column address, and a column region selecting unit that allows at least one of first to fourth column regions of the first sub-bank region and first to fourth column regions of the second sub-bank region to be selectively activated, in response to the first to fourth column region activating addresses.

15 Claims, 2 Drawing Sheets

ADDRESS REPLACING CIRCUIT AND SEMICONDUCTOR MEMORY APPARATUS HAVING THE SAME

CROSS-REFERENCE TO RELATED PATENT APPLICATION

This application claims the benefit under 35 U.S.C 119(a) of Korean Application No. 10-2007-0089887, filed on Sep. 5, 2007, in the Korean Intellectual Property Office, the disclosure of which is incorporated herein in its entirety by reference as if set forth in full.

BACKGROUND

1. Technical Field

The embodiments described herein are related to a semiconductor memory apparatus, in particular, to an address replacing circuit and a semiconductor memory apparatus having the same.

2. Related Art

A conventional semiconductor memory apparatus selects a word line designated by a row address and activates corresponding memory cells. The semiconductor memory apparatus activates a column selection signal designated by a column address and performs a data input/output operation on corresponding memory cells. During an active operation of the semiconductor memory apparatus, one of a plurality of memory banks is activated, and one column selection signal designed by a column address is enabled.

As such, the semiconductor memory apparatus includes a row decoder that selects a word line according to a row address, and a column decoder that enables a column selection signal according to a column address.

In the general semiconductor memory apparatus, the number of row addresses is determined according to the international standard, which is defined by JEDEC (Joint Electron Device Engineering Council). The international standard defines the number of row addresses according to a capacity of the semiconductor memory apparatus and the amount of data input/output at a time. For example, in the case of a semiconductor memory apparatus (hereinafter, referred to as X32 semiconductor memory apparatus) in which a capacity is 1 GByte and the amount of data input/output at a time is 32, the number of row addresses is set to 13. In this case, in the case where a fourteenth row address needs to be used, one bit of a column address is additionally used to replace a function of the fourteenth row address, in the conventional semiconductor memory apparatus. However, according to this technology, unnecessary bit lines are activated, thereby causing a power loss.

In addition, in the case where two semiconductor memory apparatuses, each having a small capacity, are juxtaposed to implement a semiconductor memory apparatus having a large capacity, the number of row addresses, which is defined by the international standard, is different for each semiconductor memory apparatus. Therefore, this technology cannot be used. For example, it is assumed that two semiconductor memory apparatuses (hereinafter, referred to as X8 semiconductor memory apparatus), where a capacity is 512 MByte and the amount of data input/output at a time is 8, are used to implement one semiconductor memory apparatus (hereinafter, referred to as X16 semiconductor memory apparatus), in which a capacity is 1 GByte and the amount of data input/ output at a time is 16. In this case, the X8 semiconductor memory apparatus uses 13 row addresses and the X16 semiconductor memory apparatus uses 14 row addresses. Therefore, there occurs a problem when using addresses.

As such, in a conventional semiconductor memory apparatus, it is difficult to effectively use the row addresses because of the standard specifications, which are defined according to the capacity and the amount of data input/output at a time. For this reason, there is a limitation in juxtaposing semiconductor memory apparatus each having a small capacity to implement a semiconductor memory apparatus having a large capacity. In addition, a large amount of time and cost are consumed in manufacturing the semiconductor memory apparatus.

SUMMARY

An address replacing circuit and a semiconductor memory apparatus having the same that make the semiconductor memory apparatus capable of being used in various environments.

According to one aspect, an address replacing circuit includes a sub-bank region selecting unit that allows a first sub-bank region or a second sub-bank region to be selectively activated, in response to a row address and first and second bits of a column address in accordance with operation modes, a first column region activating unit that generates a first column region activating address and a second column region activating address from the first bit of the column address, a second column region activating unit that generates a third column region activating address and a fourth column region activating address from the second bit of the column address, and a column region selecting unit that allows at least one of first to fourth column regions of the first sub-bank region and first to fourth column regions of the second sub-bank region to be selectively activated, in response to the first to fourth column region activating addresses.

According to another aspect, a semiconductor memory apparatus includes a memory bank that includes a first sub-bank region and a second sub-bank region, an address replacing circuit that generates first and second sub-bank region activating signals from a row address in response to operation mode signals, and a column decoder that activates the first sub-bank region or the second sub-bank region in response to the first and second sub-bank region activating signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
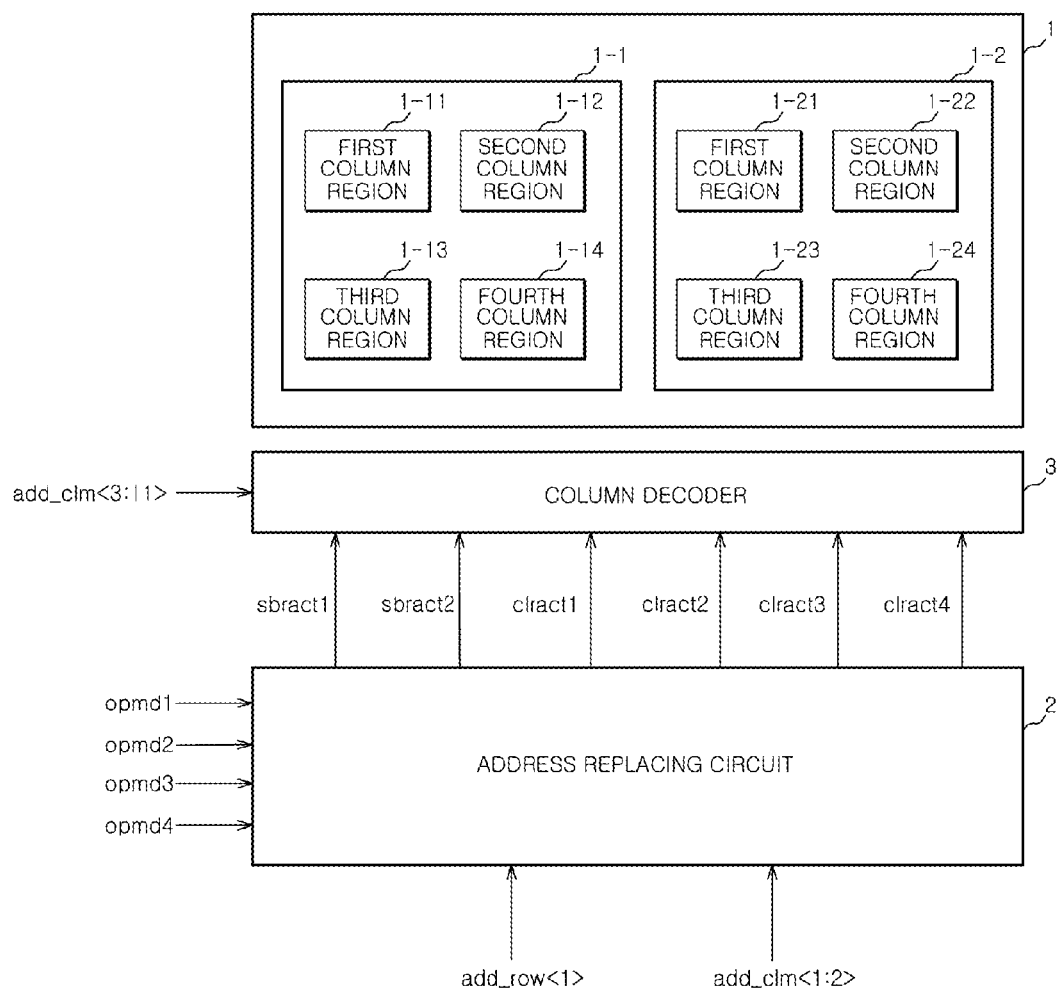
FIG. 1 is a block diagram illustrating an example semiconductor memory apparatus that includes a address replacing unit configured in accordance with one embodiment.

Referring to FIG. 1, a semiconductor memory apparatus 10 configured in accordance with one embodiment can include a memory bank 1, an address replacing circuit 2, and a column decoder 3.

The memory bank 1 can include a first sub-bank region 1-1 and a second sub-bank region 1-2.

In response to first to fourth operation mode signals 'opmd1' to 'opmd4', the address replacing circuit 2 can be configured to generate first and second sub-bank region activating signals 'sbract1' and 'sbract2' and first to fourth column region activating signals 'clract1' to 'clract4' according to a first bit of a row address 'add_row<1>' and first and second column addresses 'add_clm<1:2>'.

In response to the first and second sub-bank region activating signals 'sbract1' and 'sbract2' and the first to fourth column region activating signals 'clract1' to 'clract4', the column decoder 3 can be configured to activate at least one of first to fourth column regions 1-11, 1-12, 1-13, and 1-14 of the first sub-bank region 1-1 and first to fourth column regions 1-21, 1-22, 1-23, and 1-24 of the second sub-bank region 1-2.

The first sub-bank region 1-1 can include the first to fourth column regions 1-11, 1-12, 1-13, and 1-14. Similarly, the second sub-bank region 1-2 can include the first to fourth column regions 1-21, 1-22, 1-23, and 1-24. In accordance with the control of the column decoder 3, the first to fourth column regions 1-11, 1-12, 1-13, and 1-14 of the first sub-bank region 1-1, and the first to fourth column regions 1-21, 1-22, 1-23, and 1-24 of the second sub-bank region 1-2 of the memory bank 1 can be selectively activated.

The first operation mode signal 'opmd1' can be enabled according to the amount of data input/output by the semiconductor memory apparatus 10 at given time. In certain embodiments, the first operation mode signal 'opmd1' can be enabled in an X32 semiconductor memory apparatus. Further, the second operation mode signal 'opmd2' can define the number of column addresses that are input to the semiconductor memory apparatus 10. In such embodiments, the second operation mode signal 'opmd2' can be enabled only when the number of valid column addresses is, e.g., 9.

Each of the third operation mode signal 'opmd3' and the fourth operation mode signal 'opmd4' can be enabled according to the amount of input/output data and the number of addresses in the semiconductor memory apparatus 10. In such embodiments, the third operation mode signal 'opmd3' can be enabled when the number of valid column addresses is, e.g., 11 in the X16 semiconductor memory apparatus, and the fourth operation mode signal 'opmd4' can be enabled in the X8 semiconductor memory apparatus.

As such, each of the first to fourth operation mode signals 'opmd1' to 'opmd4', which define the operation modes of the semiconductor memory apparatus 10, can be implemented through a bonding option. A logical value of the first to fourth operation mode signals 'opmd1' to 'opmd4' can be set according to the environment and available conditions after testing the semiconductor memory apparatus 10.

The first bit of the row address 'add_row<1>', which is input to the address replacing circuit 2, can be an address that is not defined by the international standard for semiconductor memory apparatus. Further, depending on the embodiment, the column decoder 3 can receive a 9 bits of a column address 'add_clm<3:11>'. At this time, the address replacing circuit 2 can be configured to use the first and second bits of the column address 'add_clm<1:2>' as column addresses to overcome the limitation in the international standard for semiconductor memory apparatus.

The column decoder 3 can be configured to respond to the first and second sub-bank region activating signals 'sbract1' and 'sbract2' and the first to fourth column region activating signals 'clract1' to 'clract4', which the address replacing circuit 2 can selectively enable according to the operation modes. Then, the column decoder 3 can be configured to control the memory bank 1 such that at least one of the first to fourth column regions 1-11, 1-12, 1-13, and 1-14 of the first sub-bank region 1-1 and the first to fourth column regions 1-21, 1-22, 1-23, and 1-24 of the second sub-bank region 1-2 are activated.

As such, the semiconductor memory apparatus 10 according to this embodiment can receive more row addresses than the number of row addresses defined by the international standard, and endow the row address, which is not defined by the international standard, with the function of the column address, which was used to substitute the row address in conventional apparatus. Therefore, in a semiconductor apparatus configured as described herein, the number of row addresses is not restricted by the international standard. Further, various operation modes can be set, and each column region of the memory bank can be activated by selectively using the row address and the column address according to each operation mode. Therefore, the semiconductor memory apparatus 10 can easily adjust to the environments and available conditions.

Figure 2:
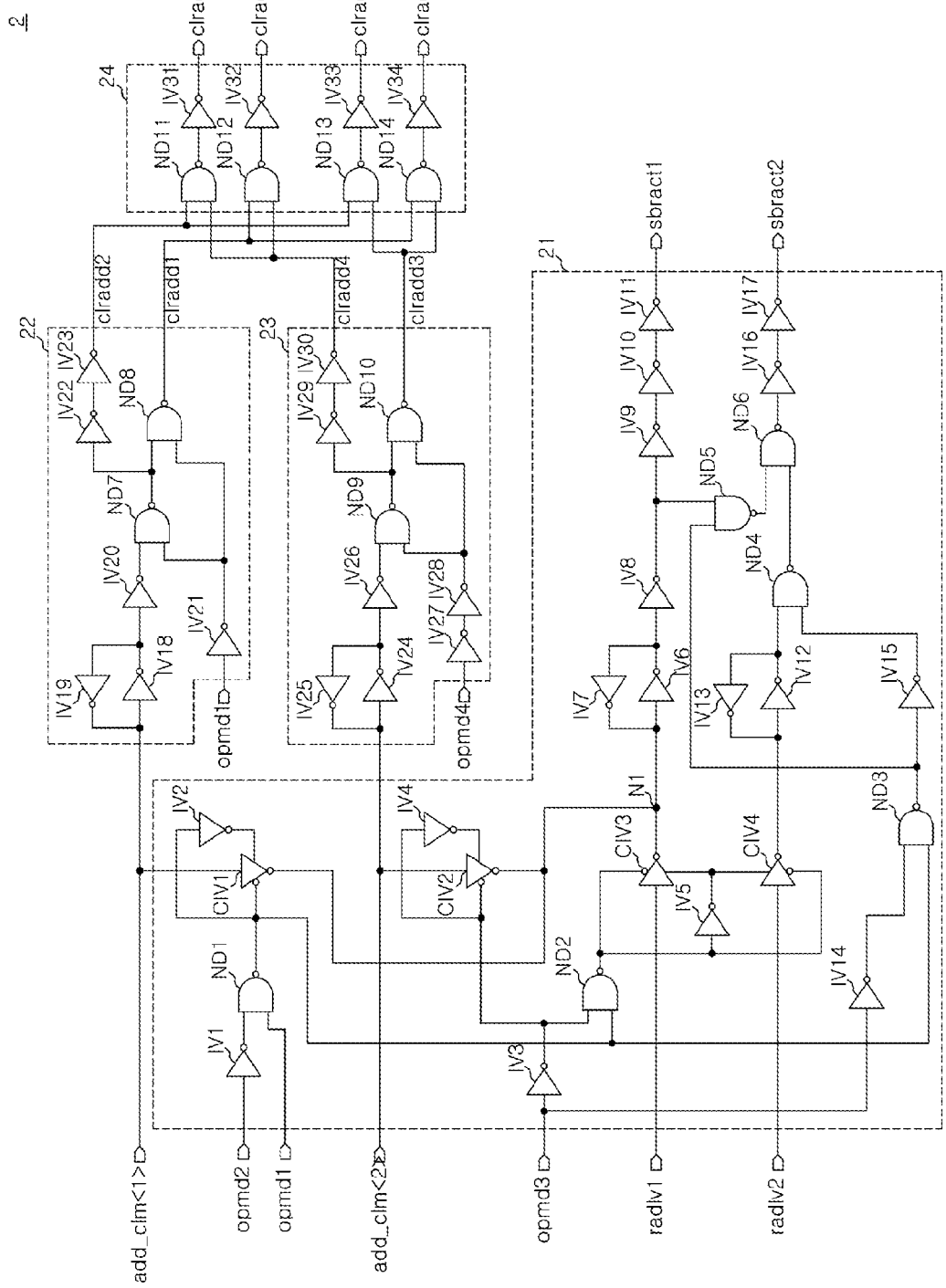
FIG. 2 is a diagram illustrating a detailed structure of the address replacing circuit shown in FIG. 1.

Referring to FIG. 2, the address replacing circuit 2 can include a sub-bank region selecting unit 21, a first column region activating unit 22, a second column region activating unit 23, and a column region selecting unit 24.

The sub-bank region selecting unit 21 can be configured to generate the first sub-bank region activating signal 'sbract1' and the second sub-bank region activating signal 'sbract2', in response to first and second row address level signals 'radlv1' and 'radlv2' and the first and second bits of the column address 'add_clm<1:2>' in accordance with the control of the first, second, and third operation mode signals 'opmd1', 'opmd2', and 'opmd3'. The first column region activating unit 22 can be configured to generate a first column region activating address 'clradd1' and a second column region activating address 'clradd2' from the first bit of the column address 'add_clm<1>', in response to the first operation mode signal 'opmd1'. The second column region activating unit 23 can be configured to generate a third column region activating address 'clradd3' and a fourth column region activating address 'clradd4' from the second bit of the column address 'add_clm<2>', in response to the fourth operation mode signal 'opmd4'. The column region selecting unit 24 can be configured to generate the first to fourth column region activating signals 'clract1' to 'clract4' in response to the first to fourth column region activating addresses 'clradd1' to 'clradd4'.

In this case, the first row address level signal 'radlv1' can be enabled when the first bit of the row address 'add_row<1>' has a voltage level at a low level. The second row address level signal 'radlv2' can be enabled when the first bit of the row address 'add_row<1>' has a high voltage level.

The sub-bank region selecting unit 21 can include a first inverter IV1, a first NAND gate ND1, a second inverter IV2, a first control inverter CIV1, a third inverter IV3, a fourth inverter IV4, and a second control inverter CIV2.

The first inverter IV1 can receive the second operation mode signal 'opmd2'. The first NAND gate ND1 can receive an output signal of the first inverter IV1 and the first operation mode signal 'opmd1'. The second inverter IV2 can receive an output signal of the first NAND gate ND1. The first control inverter CIV1 can be configured to invert the first bit of the column address 'add_clm<1>' according to the control of the output signal of the first NAND gate ND1 and the output signal of the second inverter IV2, and transfer the inverted signal to a first node N1. The third inverter IV3 can receive the third operation mode signal 'opmd3'. The fourth inverter IV4 can receive an output signal of the third inverter IV3. The second control inverter CIV2 can be configured to invert the second column bit of the address 'add_clm<2>' according to the control of the output signal of the third inverter IV3 and the output signal of the fourth inverter IV4 and transfer the inverted signal to the first node N1.

The sub-bank region selecting unit 21 can further include a second NAND gate ND2, a fifth inverter IV5, a third control inverter CIV3, a sixth inverter IV6, a seventh inverter IV7, an eighth inverter IV8, a ninth inverter IV9, a tenth inverter IV10, and an eleventh inverter IV11.

The second NAND gate ND2 can receive an output signal of the third inverter IV3 and an output signal of the first NAND gate ND1. The fifth inverter IV5 can receive an output signal of the second NAND gate ND2. The third control inverter CIV3 can be configured to invert the first row address level signal 'radlv1' according to the control of the output signal of the second NAND gate ND2 and the output signal of the fifth inverter IV5 and transfer the inverted signal to the first node N1. The sixth inverter IV6 can invert a level of a voltage that is applied at the first node N1. The seventh inverter IV7 can form a latch structure together with the sixth inverter IV6. The eighth inverter IV8 can receive an output signal of the sixth inverter IV6. The ninth inverter IV9 can receive an output signal of the eighth inverter IV8. The tenth inverter IV10 can receive an output signal of the ninth inverter IV9. The eleventh inverter IV11 can receive an output signal of the tenth inverter IV10 and can be configured to output the first sub-bank region activating signal 'sbract1'.

The sub-bank region selecting unit 21 can further include a fourth control inverter CIV4, a twelfth inverter IV12, a thirteenth inverter IV13, a fourteenth inverter IV14, a third NAND gate ND3, a fifteenth inverter IV15, a fourth NAND gate ND4, a fifth NAND gate ND5, a sixth NAND gate ND6, a sixteenth inverter IV16, and a seventeenth inverter IV17.

The fourth control inverter CIV4 can be configured to invert the second row address level signal 'radlv2' according to the control of the output signal of the second NAND gate ND2 and the output signal of the fifth inverter IV5. The twelfth inverter IV12 can receive an output signal of the fourth control inverter CIV4. The thirteenth inverter IV13 can form a latch structure together with the twelfth inverter IV12. The fourteenth inverter IV14 can receive the third operation mode signal 'opmd3'. The third NAND gate ND3 can receive the output signal of the first NAND gate ND1 and an output signal of the fourteenth inverter IV14. The fifteenth inverter IV15 can receive an output signal of the third NAND gate ND3. The fourth NAND gate ND4 can receive an output signal of the twelfth inverter IV12 and an output signal of the fifteenth inverter IV15. The fifth NAND gate ND5 can receive the output signal of the eighth inverter IV8 and the output signal of the third NAND gate ND3. The sixth NAND gate ND6 can receive an output signal of the fourth NAND gate ND4 and an output signal of the fifth NAND gate ND5. The sixteenth inverter IV16 can receive an output signal of the sixth NAND gate ND6. The seventeenth inverter IV17 can receive an output signal of the sixteenth inverter IV16 and output the second sub-bank region activating signal 'sbract2'.

The first column region activating unit 22 can include an eighteenth inverter IV18, a nineteenth inverter IV19, a twentieth inverter IV20, a twenty-first inverter IV21, a sixth NAND gate ND6, a seventh NAND gate ND7, a twenty-second inverter IV22, and a twenty-third inverter IV23.

The eighteenth inverter IV18 can receive the first bit of the column address 'add_clm<1>'. The nineteenth inverter IV19 can form a latch structure together with the eighteenth inverter IV18. The twentieth inverter IV20 can receive an output signal of the eighteenth inverter IV18. The twenty-first inverter IV21 can receive the first operation mode signal 'opmd1'. The sixth NAND gate ND6 can receive an output signal of the twentieth inverter IV20 and an output signal of the twenty-first inverter IV21. The seventh NAND gate ND7 can receive an output signal of the twenty-first inverter IV21 and an output signal of the sixth NAND gate ND6 and output the first column region activating address 'clradd1'. The twenty-second inverter IV22 can receive the output signal of the sixth NAND gate ND6. The twenty-third inverter IV23 can receive an output signal of the twenty-second inverter IV22 and output the second column region activating address 'clradd2'.

The second column region activating unit 23 can include a twenty-fourth inverter IV24, a twenty-fifth inverter IV25, a twenty-sixth inverter IV26, a twenty-seventh inverter IV27, a twenty-eighth IV28, an eighth NAND gate ND8, a ninth NAND gate ND9, a twenty-ninth inverter IV29, and a thirtieth inverter IV30.

The twenty-fourth inverter IV24 can receive the second bit of the column address 'add_clm<2>'. The twenty-fifth inverter IV25 can form a latch structure together with the twenty-fourth inverter IV24. The twenty-sixth inverter IV26 can receive an output signal of the twenty-fifth inverter IV25. The twenty-seventh inverter IV27 can receive the fourth operation mode signal 'opmd4'. The twenty-eighth inverter IV28 can receive an output signal of the twenty-seventh inverter IV27. The eighth NAND gate ND8 can receive an output signal of the twenty-sixth inverter IV26 and an output signal of the twenty-eighth inverter IV28. The ninth NAND gate ND9 can receive the output signal of the twenty-eighth inverter IV28 and an output signal of the eighth NAND gate ND8, and output the third column region activating address 'clradd3'. The twenty-ninth inverter IV29 can receive the output signal of the eighth NAND gate ND8. The thirtieth inverter IV30 can receive an output signal of the twenty-ninth inverter IV29 and output the fourth column region activating address 'clradd4'.

The column region selecting unit 24 can include a tenth NAND gate ND10, a thirty-first inverter IV31, an eleventh NAND gate ND11, a thirty-second inverter IV32, a twelfth NAND gate ND12, a thirty-third inverter IV33, a thirteenth NAND gate ND13, and a thirty-fourth inverter IV34.

The tenth NAND gate ND10 can receive the second column region activating address 'clradd2' and the fourth column region activating address 'clradd4'. The thirty-first inverter IV31 can receive an output signal of the tenth NAND gate ND10 and output the first column region activating signal 'clract1'. The eleventh NAND gate ND11 can receive the first column region activating address 'clradd1' and the fourth column region activating address 'clradd4'. The thirty-second inverter IV32 can receive an output signal of the eleventh NAND gate ND11 and output the second column region activating signal 'clract2'. The twelfth NAND gate ND12 can receive the second column region activating address 'clradd2' and the third column region activating address 'clradd3'. The thirty-third inverter IV33 can receive an output signal of the twelfth NAND gate ND12 and output the third column region activating signal 'clract3'. The thirteenth NAND gate ND13 can receive the first column region activating address 'clradd1' and the third column region activating address 'clradd3'. The thirty-fourth inverter IV34 can receive an output signal of the thirteenth NAND gate ND13 and output the fourth column region activating signal 'clract4'.

If the address replacing circuit 2 that has the above-described structure can included in the X32 semiconductor memory apparatus that uses 13 bits of row addresses and 10 bits of column addresses. In such embodiments, only the first operation mode signal 'opmd1' of the first to fourth operation mode signals 'opmd1' to 'opmd4' can be enabled. Therefore, the first control inverter CIV1 of the sub-bank region selecting unit 21 can be turned on, and the second control inverter CIV2 and the third control inverter CIV3 can be turned off. Thus, the first bit of the column address 'add_clm<1>' can be inverted and can be transferred to the first node N1. At this time, since the output signal of the third NAND gate ND3 and the output signal of the fourth NAND gate ND4 are at a high level, the first sub-bank region activating signal 'sbract1' can have a voltage level that is obtained by inverting a voltage level at the first node N1, and the second sub-bank region activating signal 'sbract2' can have a voltage level that is the same as the voltage level at the first node N1.

In this case, all of the first to fourth column region activating addresses 'clradd1' to 'clradd4', which are output through the first column region activating unit 22 and the second column region activating unit 23, transition to a high level. Therefore, the first to fourth column region activating signals 'clract1' to 'clract4' also transition to a high level. That is, the first sub-bank region 1-1 or the second sub-bank region 1-2 can be selectively activated, and all of the first to fourth column regions, which are included in the activated sub-bank region, can be activated. This case exemplifies the case of using the first bit of the column address 'add_clm<1>' to substitute a row address, which is not defined by the international standard, by using one more bit of the column addresses than in conventional devices.

If the address replacing circuit 2 can be included in the X32 semiconductor memory apparatus that uses 14 bits of row addresses and 9 bits of column addresses. In which case, the first operation mode signal 'opmd1' and the second operation mode signal 'opmd2' of the first to fourth operation mode signals 'opmd1' to 'opmd4' can be enabled. Therefore, the first control inverter CIV1 and the second control inverter CIV2 of the sub-bank region selecting unit 21 can be turned off, and the third control inverter CIV3 and the fourth control inverter CIV4 of the sub-bank region selecting unit 21 can be turned on. At this time, since the output signal of the fifteenth inverter IV15 and the output signal of the fifth NAND gate ND5 are at a high level, the first sub-bank region activating signal 'sbract1' will have the same voltage level as the first row address level signal 'radlv1', and the second sub-bank region activating signal 'sbract2' will have the same voltage level as the second row address level signal 'radlv2'.

In the same manner as described above, all of the first to fourth column region activating addresses 'clradd1' to 'clradd4', which are output through the first column region activating unit 22 and the second column region activating unit 23, transition to a high level. Therefore, the first to fourth column region activating signals 'clract1' to 'clract4' also transition to a high level. That is, the first sub-bank region 1-1 or the second sub-bank region 1-2 can be selectively activated, and all of the first to fourth column regions, which are included in the activated sub-bank region, can be activated. This is different than in a conventional device. The first row bit of the address 'add_row<1>' can be used as the column address to perform the same function as in a conventional device.

If the address replacing circuit 2 is included in the X16 semiconductor memory apparatus that uses 14 bits of row addresses and 10 bits of column addresses, then all of the first to fourth operation mode signals 'opmd1' to 'opmd4' can be disabled. Also in this case, the voltage level of the first sub-bank region activating signal 'sbract1' becomes the same voltage level as the first row address level signal 'radlv1', and the voltage level of the second sub-bank region activating signal 'sbract2' becomes the same voltage level as the second row address level signal 'radlv2'.

In addition, the third and fourth column region activating addresses 'clradd3' and 'clradd4', which are output from the second column region activating unit 23, transition to a high level. Meanwhile, the voltage levels of the first and second column region activating addresses 'clradd1' and 'clradd2', which are output from the first column region activating unit 22, can be defined by the first bit of the column address 'add_clm<1>'. The voltage levels of the first and second column region activating addresses 'clradd1' and 'clradd2' can be opposite to each other. Therefore, the column region selecting unit 24 can activate only two of the first to fourth column region activating signals 'clract1' to 'clract4' according to the voltage levels of the first and second column region activating addresses 'clradd1' and 'clradd2'. As a result, the first sub-bank region 1-1 or the second sub-bank region 1-2 can be selectively activated, and only two of the first to fourth column regions, which are included in the activated sub-bank region, can be activated. That is, the first bit of the row address 'add_row<1>' can be used as the column address to select one of the sub-bank regions, and the first bit of the column address 'add_clm<1>' can be used to selectively activate the two column regions.

If the address replacing circuit 2 is included in the X16 semiconductor memory apparatus that uses 13 bits of row addresses and 11 bits of column addresses, then only the third operation mode signal 'opmd3' of the first to fourth operation mode signals 'opmd1' to 'opmd4' can be enabled. Therefore, the first, third, and fourth control inverters CIV1, CIV3, and CIV4 of the sub-bank region selecting unit 21 can be turned off, and the second control inverter CIV2 of the sub-bank region selecting unit 21 can be turned on. Thus, the second column bit of the address 'add_clm<2>' can be inverted and transferred to the first node N1. At this time, since the output signal of the third NAND gate ND3 and the output signal of the fourth NAND gate ND4 are at a high level, the first sub-bank region activating signal 'sbract1' can have a voltage level that is obtained by inverting a voltage level at the first node N1, and the second sub-bank region activating signal 'sbract2' can have the same voltage level as in the first node N1.

In addition, the third and fourth column region activating addresses 'clradd3' and 'clradd4', which are output from the first column region activating unit 22, transition to a high level. Meanwhile, the voltage levels of the first and second column region activating addresses 'clradd1' and 'clradd2', which are output from the first column region activating unit 22, can be defined by the first bit of the column address 'add_clm<1>'. The voltage levels of the first and second column region activating addresses 'clradd1' and 'clradd2' can be opposite to each other. Therefore, the column region selecting unit 24 can be configured to activate only two of the first to fourth column region activating signals 'clract1' to 'clract4' according to the voltage levels of the first and second column region activating addresses 'clradd1' and 'clradd2'. As a result, the first sub-bank region 1-1 or the second sub-bank region 1-2 can be selectively activated, and only two of the first to fourth column regions, which are included in the activated sub-bank region, can be activated. That is, the second bit of the column address 'add_clm<2>' can be used to select one of the sub-bank regions, and the first bit of the column address 'add_clm<1>' can be used to selectively activate the two column regions.

If the address replacing circuit 2 is included in the X8 semiconductor memory apparatus that uses 14 bits of row addresses and 11 bits of column addresses, then only the fourth operation mode signal 'opmd4' of the first to fourth operation mode signals 'opmd1' to 'opmd4' can be enabled.

Therefore, the first control inverter CIV1 and the second control inverter CIV2 of the sub-bank region selecting unit 21 can be turned off, and the third control inverter CIV3 and the fourth control inverter CIV4 of the sub-bank region selecting unit 21 can be turned on. At this time, since the output signal of the fifteenth inverter IV15 and the output signal of the fifth NAND gate ND5 are at a high level, the voltage level of the first sub-bank region activating signal 'sbract1' becomes the same voltage level as the first row address level signal 'radlv1', and the voltage level of the second sub-bank region activating signal 'sbract2' becomes the same voltage level as the second row address level signal 'radlv2'.

In this case, the voltage levels of the first and second column region activating addresses 'clradd1' and 'clradd2', which are output from the first column region activating unit 22, can be defined by the first bit of the column address 'add_clm<1>'. The voltage levels of the first and second column region activating addresses 'clradd1' and 'clradd2' can be opposite to each other. Further, the voltage levels of the third and fourth column region activating addresses 'clradd3' and 'clradd4', which are output from the second column region activating unit 23, can be defined by the second bit of the column address 'add_clm<2>'. The voltage levels of the third and fourth column region activating addresses 'clradd3' and 'clradd4' can be opposite to each other. Therefore, the column region selecting unit 24 can be configured to allow it to be the high level that only activates one of the first to fourth column region activating signals 'clract1' to 'clract4' according to the voltage levels of the first to fourth column region activating addresses 'clradd1' to 'clradd4'. As a result, the first sub-bank region 1-1 or the second sub-bank region 1-2 can be selectively activated, and only one of the first to fourth column regions, which are included in the activated sub-bank region, can be activated. That is, the first bit of the row address 'add_row<1>' can be used as the column address to select the sub-bank region, and the first and second bit of the column addresses 'add_clm<1>' and 'add_clm<2>' can be used to select one of the column regions in the selected sub-bank region.

As described above, in an address replacing circuit configured in accordance with the systems and methods described herein, if the row addresses of the number of bits that is larger than the number of bits of the row addresses defined by the international standard are input, then the function of the column address is endowed for an extra row address, thereby preventing power loss due to an increase in the number of bits of the column addresses. Accordingly, the address replacing circuit and the semiconductor memory apparatus having the same can normally operate even though the row addresses has more bits than the number of bits defined by the international standard are input.

Further, an address replacing circuit configured in accordance with the embodiments described herein can easily adjust to conditions, such as the number of row addresses and column addresses and a capacity of the semiconductor memory apparatus, thereby overcoming disadvantages in the international standard that restricts implementing a large capacity semiconductor memory apparatus by juxtaposing semiconductor memory apparatus having small capacities. Therefore, at the time of manufacturing the semiconductor memory apparatus, time and cost can be drastically reduced.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An address replacing circuit, comprising:
a sub-bank region selecting unit configured to allow a first sub-bank region or a second sub-bank region to be selectively activated, in response to a row address and first and second bits of a column addresses in accordance with operation modes;
a first column region activating unit configured to generate a first column region activating address and a second column region activating address from the first bit of the column address;
a second column region activating unit configured to generate a third column region activating address and a fourth column region activating address from the second bit of the column address; and
a column region selecting unit configured to allow at least one of first to fourth column regions of the first sub-bank region and first to fourth column regions of the second sub-bank region to be selectively activated, in response to the first to fourth column region activating addresses;
wherein the row address correspond to an address that is not defined by the JEDEC (Joint Electron Device Engineering Council) international standard.

2. The address replacing circuit of claim 1, wherein each of the operation modes is defined according to the amount of data, which is input/output by a semiconductor memory apparatus, and the number of valid bits of the row address and the column address, which are used in the semiconductor memory apparatus.

3. The address replacing circuit of claim 2, wherein the operation modes are defined according to whether or not a plurality of operation mode signals are enabled, and wherein logical values of the plurality of operation mode signals are set by bonding options.

4. The address replacing circuit of claim 1, wherein, when the row address has a valid value, the sub-bank region selecting unit is configured to allow the first sub-bank region or the second sub-bank region to be selectively activated according to a voltage level of the row address.

5. The address replacing circuit of claim 1, wherein, when the row address does not have a valid value, the sub-bank region selecting unit is configured to allow the first sub-bank region or the second sub-bank region to be selectively activated according to a voltage level of the first column address or the second column address.

6. The address replacing circuit of claim 1, wherein, when one of the row address and the first and second bits of the column address has a valid value, the column region selecting unit is configured to allow all of the first to fourth column regions of the first sub-bank region or the first to fourth column regions of the second sub-bank region to be activated.

7. The address replacing circuit of claim 1, wherein, when two bits of the row address and the first and second bits of the column address have valid values, the column region selecting unit is configured to allow two of the first to fourth column regions of the first sub-bank region or two of the first to fourth column regions of the second sub-bank region to be activated.

8. The address replacing circuit of claim 1, wherein, when all of the bits of the row address and the first and second bits of the column address have valid values, the column region selecting unit allows one of the first to fourth column regions of the first sub-bank region or one of the first to fourth column regions of the second sub-bank region to be activated.

9. A semiconductor memory apparatus, comprising:
- a memory bank that includes a first sub-bank region and a second sub-bank region;
- an address replacing circuit configured to generate first and second sub-bank region activating signals from a row address in response to operation mode signals; and
- a column decoder configured to activate the first sub-bank region or the second sub-bank region in response to the first and second sub-bank region activating signals;
- wherein each of the first sub-bank region and the second sub-bank region includes a plurality of column regions;
- wherein the row address corresponds to an address that is not defined by the JEDEC (Joint Electron Device Engineering Council) international standard.

10. The semiconductor memory apparatus of claim 9, wherein each of the operation mode signals is enabled or not according to the amount of data, which is input/output by the semiconductor memory apparatus at a time in a given environment, and the number of valid row address bits and column address bits, which are used in the semiconductor memory apparatus.

11. The semiconductor memory apparatus of claim 10, wherein logical values of the plurality of operation mode signals are set by bonding options, respectively.

12. The semiconductor memory apparatus of claim 9, wherein the address replacing circuit includes:
- a sub-bank region selecting unit configured to generate the first and second sub-bank region activating signals in response to the row address and first and second bits of the column address in accordance with the control of the plurality of operation mode signals;
- a first column region activating unit configured to generate a first column region activating address and a second column region activating address from the first bit of the column address;
- a second column region activating unit configured to generate a third column region activating address and a fourth column region activating address from the second bit of the column address; and
- a column region selecting unit configured to generate a plurality of column region activating signals in response to the first to fourth column region activating addresses.

13. The semiconductor memory apparatus of claim 12, wherein, when the row address has a valid value, the sub-bank region selecting unit is configured to selectively enable the first sub-bank region activating signal or the second sub-bank region activating signal according to a voltage level of the row address.

14. The semiconductor memory apparatus of claim 12, wherein, when the row address does not have a valid value, the sub-bank region selecting unit is configured to selectively enable the first sub-bank region activating signal or the second sub-bank region activating signal according to a voltage level of the first bit of the column address or the second bit of the column address.

15. The semiconductor memory apparatus of claim 12, wherein the column decoder is configured to activate at least one of a plurality of column regions in the first sub-bank region or at least one of a plurality of column regions in the second sub-bank region, in response to the plurality of column region activating signals.

* * * * *